US010608649B1

United States Patent
Jayakumar et al.

(10) Patent No.: US 10,608,649 B1
(45) Date of Patent: Mar. 31, 2020

(54) RELATIVE FREQUENCY OFFSET ERROR AND PHASE ERROR DETECTION FOR CLOCKS

(71) Applicant: Silicon Laboratories Inc., Austin, TX (US)

(72) Inventors: Kannanthodath V. Jayakumar, Austin, TX (US); James David Barnette, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/194,678

(22) Filed: Nov. 19, 2018

(51) Int. Cl.
*H03L 7/087* (2006.01)
*H03L 7/18* (2006.01)
*H03L 7/093* (2006.01)
*H03L 7/089* (2006.01)

(52) U.S. Cl.
CPC ............ *H03L 7/087* (2013.01); *H03L 7/0898* (2013.01); *H03L 7/093* (2013.01); *H03L 7/18* (2013.01)

(58) Field of Classification Search
CPC ......... H03L 7/087; H03L 7/0898; H03L 7/18; H03L 7/093; H03L 7/085
See application file for complete search history.

(56) References Cited

U.S. PATENT DOCUMENTS

| 6,278,746 B1 * | 8/2001 | Velez | H03D 3/006 |
| | | | 329/306 |
| 7,405,628 B2 | 7/2008 | Hulfachor et al. | |
| 8,552,767 B1 * | 10/2013 | Nikaeen | H03B 21/00 |
| | | | 327/105 |
| 8,791,734 B1 | 7/2014 | Hara et al. | |
| 2002/0027886 A1 | 3/2002 | Fischer et al. | |

* cited by examiner

*Primary Examiner* — Jung Kim
(74) *Attorney, Agent, or Firm* — Zagorin Cave LLP

(57) ABSTRACT

An apparatus for providing a clock signal based on a received clock signal includes a time-to-digital converter configured to generate timestamp information based on the received clock signal. The apparatus includes a first filter configured to generate clock period information based on the timestamp information. The apparatus includes a phase monitor circuit. The phase monitor circuit includes a second filter configured to provide a mean period signal of the received clock signal based on the clock period information. The phase monitor includes a phase error detection circuit configured to generate a phase error indicator based on a threshold difference value and a difference between the clock period information and expected clock period information. The expected clock period information is based on the mean period signal.

18 Claims, 10 Drawing Sheets

US 10,608,649 B1

RELATIVE FREQUENCY OFFSET ERROR AND PHASE ERROR DETECTION FOR CLOCKS

BACKGROUND

Field of the Invention

This invention relates to integrated circuits and more particularly to clock generator integrated circuits.

Description of the Related Art

In general, a clock generator produces an output clock signal having a specified frequency by locking an input clock signal to a reference clock signal. The clock generator may produce an alarm in response to one or more characteristics of the output signal being outside of clock quality specifications, e.g., frequency and jitter specifications, that vary according to a target application. In addition, the clock generator may produce an alarm and/or continue to generate the output clock signal in response to detecting loss of the input clock signal. Conventional clock quality characterization techniques trade off speed of detection with resolution of error detection. Accordingly, improved techniques for evaluating clock signal quality are desired.

SUMMARY OF EMBODIMENTS OF THE INVENTION

In at least one embodiment of the invention, an apparatus for providing a clock signal based on a received clock signal includes a time-to-digital converter configured to generate timestamp information based on the received clock signal. The apparatus includes a first filter configured to generate clock period information based on the timestamp information. The apparatus includes a phase monitor circuit. The phase monitor circuit includes a second filter configured to provide a mean period signal of the received clock signal based on the clock period information. The phase monitor includes a phase error detection circuit configured to generate a phase error indicator based on a threshold difference value and a difference between the clock period information and expected clock period information. The expected clock period information is based on the mean period signal.

In at least one embodiment of the invention, a method for providing a clock signal based on a received clock signal includes generating timestamp information based on the received clock signal. The method includes generating clock period information based on the timestamp information. The method includes generating a mean clock period signal based on the clock period information. The method includes generating a phase error indicator based on a threshold difference value and a difference between the mean clock period signal and expected clock period information, the expected clock period information being based on the mean clock period signal.

In at least one embodiment of the invention, a method includes generating a plurality of phase error signals. Each phase error signal is based on a difference between a mean clock period information and expected clock period information. The mean clock period information is determined over a first interval and the expected clock period information is determined over a second interval. The first interval is shorter than the second interval. The method includes updating each first interval in response to a variance of the mean clock period information.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
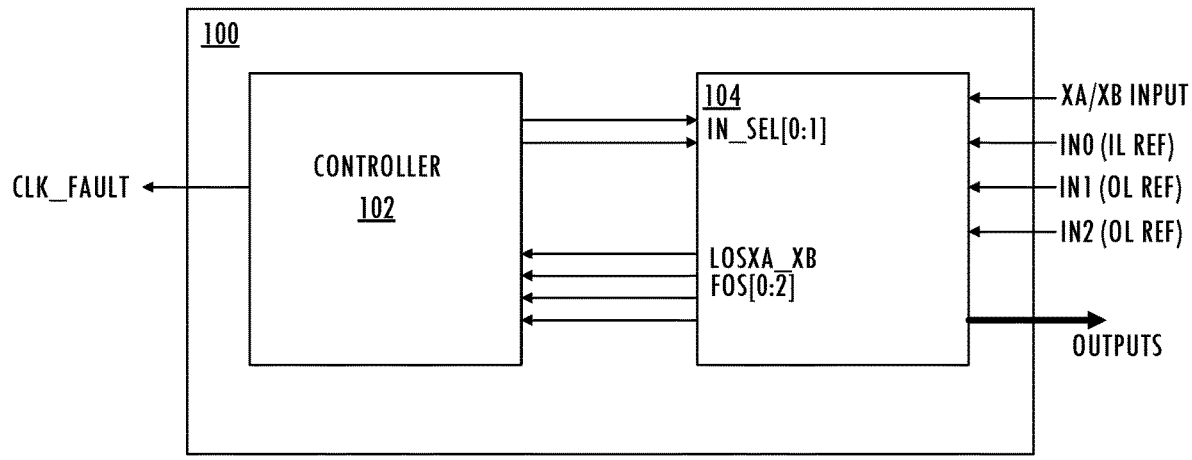
FIG. 1 illustrates a functional block diagram of an exemplary clock generator product.

Referring to FIG. 1, clock product 100 includes controller 102 and clock generator 104, which monitors at least one received clock signal (e.g., using a crystal oscillator including an external crystal coupled to XA/XB input terminal) and provides at least one output clock signal and at least one error signal. Controller 102 provides configuration information to clock generator 104 using IN_SEL[0:1]. Clock generator 104 provides clock quality information (e.g., LOSXA_XB or FOS[0:2]) to controller 102, which outputs one or more alarm signals (e.g., CLK_FAULT) based on the clock quality information.

Figure 2:
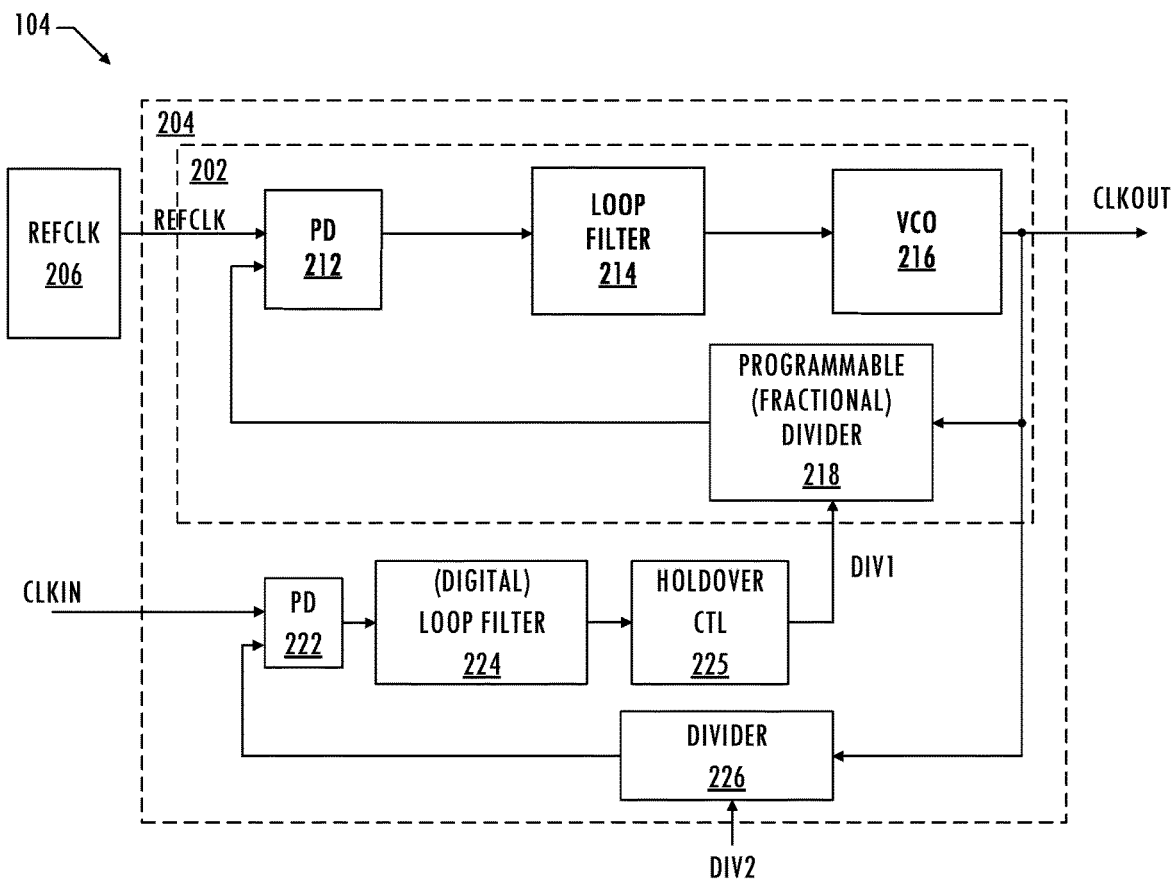
FIG. 2 illustrates a functional block diagram of an exemplary cascaded phase-locked loop clock generation circuit.

Referring to FIG. 2, in at least one embodiment, clock generator 104 includes a multi-loop phase-locked loop that generates output clock signal CLKOUT having low jitter, by locking input clock signal CLKIN to a clock signal provided by reference clock source 206. Inner phase-locked loop 202, is a first phase-locked loop that includes phase/frequency detector 212, loop filter 214, and voltage-controlled oscillator 216. Voltage controlled oscillator 216 may be implemented as a ring oscillator, an LC oscillator, or other suitable oscillator structure. Phase/frequency detector 212 receives the clock signal from reference clock source 206, which includes a fixed source such as a crystal oscillator, a microelectromechanical structure (MEMS) oscillator, or other suitable low-jitter source. Outer phase-locked loop 204 is another phase-locked loop that includes phase/frequency detector 222, loop filter 224, divider 226, and uses inner phase-locked loop 202 as a digitally controlled oscillator responsive to digital divider ratio DIV1 which may be a fractional divider value provided by loop filter 224. Phase/frequency detector 222 receives input clock signal CLKIN and a feedback signal, which may be a frequency-divided version of CLKOUT. Phase/frequency detector 222 provides a phase error signal reflecting the difference between input clock signal CLKIN and the feedback signal. The frequency of CLKOUT is determined by the frequency of reference clock source 206 and the divider ratio generated by outer phase-locked loop 204 and provided to divider 218 in the feedback path of inner phase-locked loop 202. Outer phase-locked loop 204 adjusts divider ratio DIV1 to match the frequency of CLKOUT to the frequency of input clock signal CLKIN or to an integer multiple (DIV2) of the frequency of input clock signal CLKIN (e.g., CLKIN=CLKOUT/DIV2).

In an embodiment of clock generator 104, when holdover controller 225 detects a holdover condition, that is, when input clock signal CLKIN is invalid, which may be indicated by a loss of signal condition indicator or an out-of-frequency condition indicator, holdover controller 225 freezes loop filter 224 of outer phase-locked loop 204 such that divider ratio DIV1 no longer tracks changes to input clock signal CLKIN, and selects a held output of the loop filter 224, or a value based on a held output of loop filter 224, to be provided to divider 218, thereby holding steady the frequency of CLKOUT. For example, holdover control 225 of outer phase-locked loop 204 holds the output of loop filter 224 to a value corresponding to a value of input clock signal CLKIN received prior to entering the holdover mode so that no updating of DIV1 occurs. In at least one embodiment of clock generator 104, during holdover mode, the feedback divider ratio provided by the outer loop to divider 218 is based on past divider values (e.g., is an average of past divider values). When the divide ratio is frozen, the output frequency of CLKOUT varies only based on frequency variation of reference clock source 206.

A typical reference clock source 206 is a relatively low-cost clock source having a jitter performance that satisfies jitter specifications for a target application. Such typical reference clock sources generate signals having a frequency that is highly dependent on temperature (e.g., approximately 15 parts-per-million (ppm)). Such poor temperature stability of reference clock source 206 results in CLKOUT having low-frequency drift after a loss of input clock signal CLKIN. That low-frequency drift may be unacceptable for a target application. A technique that improves the stability of an output clock signal when an input clock signal disappears (i.e., reduces low-frequency drift after loss of input clock signal CLKIN), locks inner phase-locked loop 202, which is used as the digitally controlled oscillator for outer phase-locked loop 204, to a temperature-stable reference clock signal generated by a frequency-stable reference clock having high temperature stability. For example, an oven-controlled crystal oscillator (OCXO) or temperature-compensated crystal oscillator (TCXO) may be used by reference clock 206.

Figure 3:
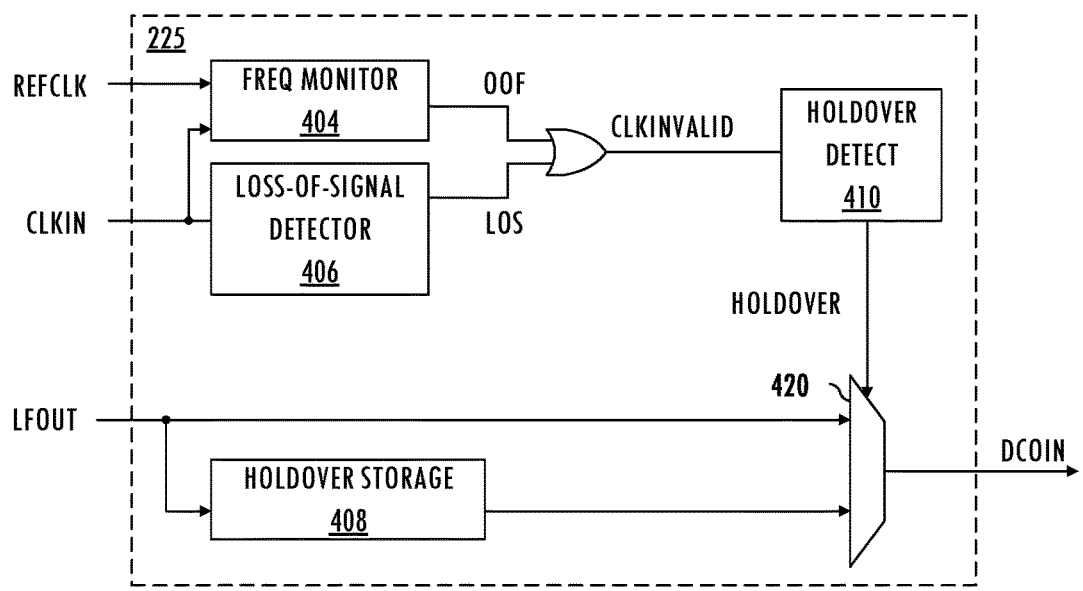
FIG. 3 illustrates a functional block diagram of holdover circuitry of the clock generation circuit of FIG. 2.

Referring to FIGS. 2 and 3, in at least one embodiment of a clock generator, holdover controller 225 implements a technique for validating input clock signal CLKIN that determines whether input clock signal CLKIN exists and/or whether the frequency of input clock signal CLKIN is within an expected range. Frequency monitor 404 generates an indication of whether input clock signal CLKIN has a frequency in the range of reference clock signal REFCLK. Loss-of-signal detector 406 determines whether input clock signal CLKIN is present. If either the frequency of input clock signal CLKIN is out of the target frequency range or a loss-of-signal condition is detected, holdover detector 410 generates an indication that input clock signal CLKIN is invalid. That indicator may be buffered in holdover storage 408. Holdover detector 410 provides an indication that triggers the holdover mode to select circuit 420, which selects a digital control value to be provided to inner phase-locked loop 202 (e.g., to control a digitally-controlled oscillator). For example, when the holdover mode is enabled, holdover controller 225 provides a value of the output of the digital loop filter 224 that has been stored in a holdover storage element 408. Otherwise, holdover controller 225 provides a dynamically updated output of a loop filter to the digitally-controlled oscillator.

Figure 4:
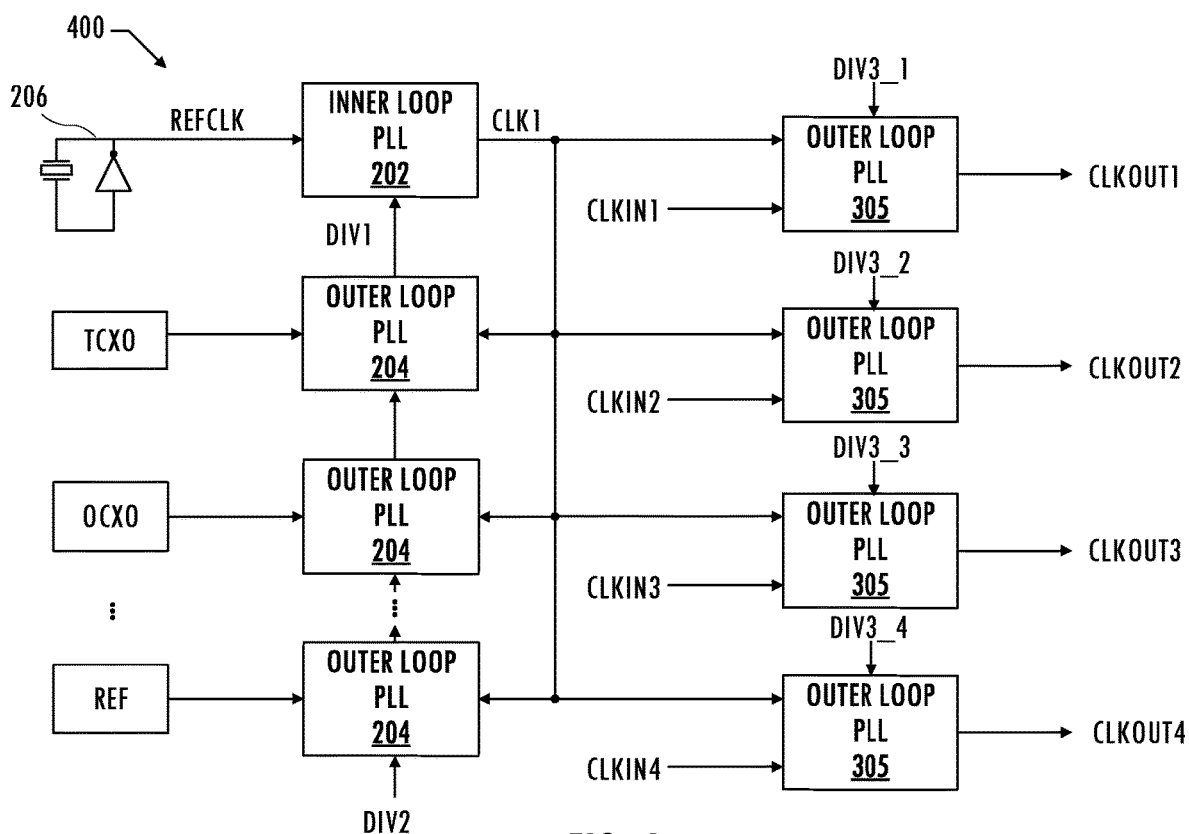
FIG. 4 illustrates a functional block diagram of an exemplary cascaded phase-locked loop clock generation circuit configured to generate multiple clock signals.

Referring to FIG. 4, cascaded phase-locked loop techniques described above may be implemented in a clock generator that generates multiple low-jitter, frequency-stable clock signals. Inner phase-locked loop 202 and outer phase-locked loop 204, are configured to provide a frequency-stable, low-jitter clock signal to multiple outer phase-locked loops 305. Each outer phase-locked loop 305 may be separately configured to generate an output clock signal, CLKOUT1, CLKOUT2, CLKOUT3, and CLKOUT4, having a different frequency based on corresponding input clock signals CLKIN1, CLKIN2, CLKIN3, and CLKIN4, respectively, and corresponding divider values, DIV3_1, DIV3_2, DIV3_3, and DIV3_4, respectively. In at least one embodiment of a clock generator, each outer loop PLL 305 includes a typical digitally controlled oscillator. Clock generator 400 may receive signals from additional reference clock generators (e.g., a temperature-controlled crystal oscillator, an oven-controlled crystal oscillator, another reference clock generator, and/or other reference clock generators) coupled to additional corresponding outer phase-locked loops 204 cascaded with inner phase-locked loop 202 to adjust the phase noise of the output clock signal(s) for a target application.

In at least one embodiment of clock generator 400, instead of including a typical digitally controlled oscillator (e.g., a voltage-controlled oscillator-based phase-locked loop), each outer phase-locked loop 305 includes an interpolative divider and associated digital logic. Eliminating the typical digitally controlled oscillators from outer phase-locked loops 305 reduces the size of the clock generator as compared to embodiments including typical digitally controlled oscillators in outer phase-locked loops 305. In addition, the use of the interpolative divider as a digitally controlled oscillator allows use of digital loop filters in the outer phase-locked loops 305, which typically are smaller than analog loop filters. Thus, clock generator 400 can generate multiple output clock signals each having a different output frequency using one voltage-controlled oscillator in a core phase-locked loop (e.g., inner phase-locked loop 202). In addition, eliminating the digitally controlled oscillators in outer phase-locked loops 305, reduces or eliminates cross talk that may result from multiple LC oscillators used in clock generators with multiple voltage-controlled oscillators.

In general, frequency offset between input clock signal CLKIN and reference clock signal REFCLK is defined in ppm, e.g., $$\text{frequency offset} = \frac{\Delta f}{F} \times 10^6 = -\frac{\Delta t}{T} \times 10^6,$$

where $\Delta f$ is the frequency difference between input clock signal CLKIN with respect to reference clock signal REFCLK, and F is the frequency of the reference clock signal REFCLK. The phase error or time error of input clock signal CLKIN is the difference between the time indicated by input clock signal CLKIN and the reference clock signal, e.g., $X(t)=T(t)-T_{ref}(t)$. The phase error or time interval error (TIE) is the difference between the measure of time interval as provided by input clock signal CLKIN and the measure of the same time interval as provided by the reference clock, TIE $(t:\tau)=x(t+\tau)-x(t)$, where $\tau$ is the time interval or observation interval. Error detection includes techniques for detecting whether noise or other impairments accompanying input clock signal CLKIN are greater than or less than thresholds defined by standards or target applications. Exemplary error detection techniques include frequency detection, jitter detection, clock wander detection, and frequency offset detection. A frequency of a clock signal is measured in cycles per true second, which can be measured or estimated by computing a first derivative of a timestamp with respect to true time. A clock signal is accompanied by jitter, which is a short-term variation in frequency that is noticeable above 10 Hz. Clock wander is a long-term variation in frequency that is noticeable in frequencies below 10 Hz. In addition, a clock signal also experiences frequency offset, drifts and phase transients or perturbations in phase for limited duration.

An exemplary clock time error model is:

$$x_n = x_0 + y_0 \Delta n + \frac{D}{2}\Delta^2 n^2 + \varepsilon_{xn},$$

where n is an integer greater than or equal to zero, $\Delta$ is the sample time, $x_0$ is the initial time error, $y_0$ is the initial fractional frequency offset, D is the linear fractional frequency drift rate, and $\varepsilon_{xn}$ is the random time error. Conventional error techniques use estimate circuits that include dead time between estimates. That dead time degrades those error detection techniques. As discussed above, the results of the error detection techniques are used to determine whether to discard input clock signal CLKIN from use in a system, allowing the system to react to the situation faster to reduce occurrence of substandard performance. For example, input clock signal CLKIN can be declared failed or valid based on the results from measurement system. An exemplary clock system uses a backup clock, if available, for operation or causes the system to enter a holdover mode, causes the system to enter a free-run mode, or causes the system to switch to a redundant device. Accurate error detection reduces or eliminates false error indication that impacts system performance. In some embodiments of a clock system, clock failure or clock valid requirements vary with target applications or standards, and the clock system adapts to the target application and supports different clock profiles or clock characteristics to address different target applications.

In at least one embodiment, holdover controller 225 improves clock quality by detecting phase errors in addition to frequency errors. The phase monitoring technique detects phase error of a clock signal using statistics for input clock signal CLKIN without using a reference clock signal. A phase monitor circuit can be manually reconfigured or can automatically adapt and adjust to meet various application needs. In some embodiments, the phase monitoring technique provides control for adaptive adjustment of the circuit in a target application. Adaptive adjustments improve time resolution and frequency resolution for fast and accurate phase error detection or frequency error detection based on real-time data and data analysis. The phase monitoring technique concurrently has increased time resolution and frequency resolution, as compared to conventional techniques. The output clock signals are suitable for network synchronization applications or other applications that use real-time clock quality monitoring. The phase monitoring and frequency monitoring techniques described further below provide a substantial amount of information to a processor that may store and analyze the information.

Figure 5:
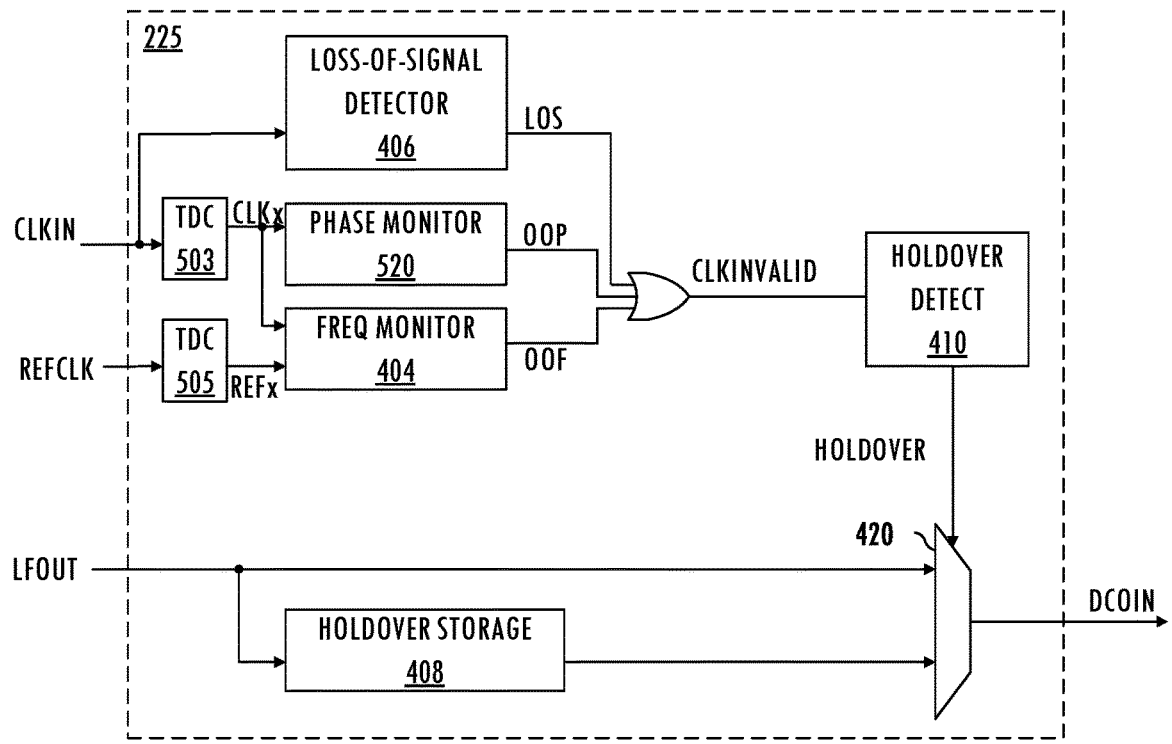
FIG. 5 illustrates a functional block diagram of holdover control circuitry of the clock generation circuit of FIG. 2, consistent with at least one embodiment of the invention.

Referring to FIG. 5, in at least one embodiment, holdover controller 225 implements frequency monitoring and phase monitoring that quickly and accurately detect frequency offset error and phase error for clocks in a clock generator. The detection is continuous, without a dead time, that is common using other techniques. Frequency monitor 404 detects relative frequency offset of input clock signal CLKIN (e.g., input clock signal CLKIN), which is the departure of a frequency of input clock signal CLKIN from its nominal frequency or is the offset between input clock signal CLKIN and the frequency of reference clock signal REFCLK.

In at least one embodiment, frequency monitor 404 and phase monitor 520 receive digital timestamps as inputs from time-to-digital converter 505 and time-to-digital converter 503, respectively. In at least one embodiment time-to-digital converter 503 and time-to-digital converter 505 are implemented by corresponding counter circuits. An exemplary time-to-digital converter provides resolution of approximately 16 ps for clock signals having frequencies less than 16 MHz. Frequency monitor 404 and phase monitor 520 use a moving average filter to generate period information based on corresponding streams of digital timestamps. The moving average filters reduce input noise by the square root of the number of points N in a window of points used in each output average. In general, increases in the number of points in the window of a moving average filter degrade time resolution but increase frequency resolution. Decreases to the number of points in the window increase time resolution but degrade frequency resolution. Time resolution refers to precision of a measurement with respect to time, e.g., how close in time $\Delta T$ two events can occur and still separately measured. By viewing signals using locally in time, the signal is approximately stationary (i.e., does not change over time) and can be analyzed using Fourier transform techniques. Regarding the associated frequency spectrum, frequency resolution refers to precision of a frequency measurement in Hz, e.g., the frequency spacing $\Delta F$ between data points of the frequency spectrum, and is determined by the window length (i.e., $\Delta f=1/T$). The frequency resolution equals the signal bandwidth divided by half the number of data points. The signal bandwidth is the maximum frequency that can be analyzed according to the Nyquist sampling theorem (i.e., the maximum frequency is half the sampling rate). For example, a bandwidth of 32 MHz with 32 data points will have a frequency resolution of 2 MHz. Thus, the frequency resolution increases with the number of data samples.

Figure 6:
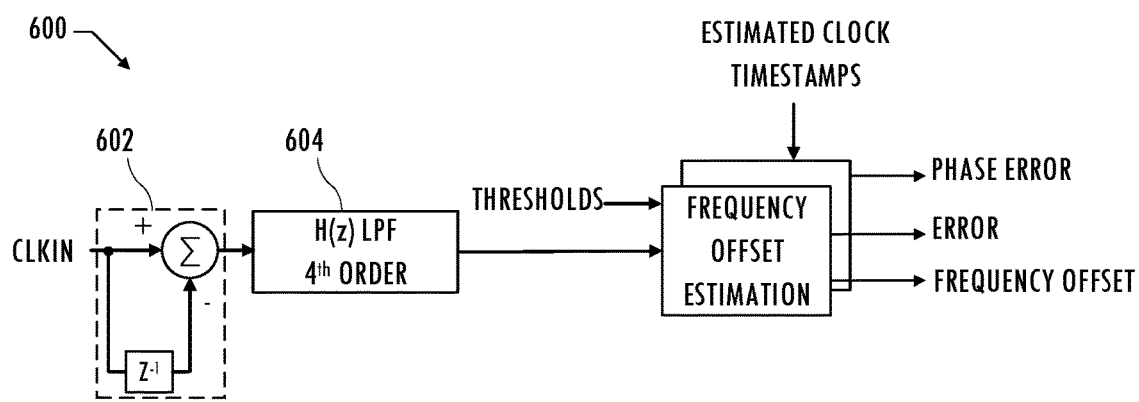
FIG. 6 illustrates a functional block diagram of monitor circuitry of the clock generation circuit of FIG. 2 consistent with at least one embodiment of the invention.

Referring to FIG. 6, an exemplary monitor that combines operations of phase monitor 520 and frequency monitor 404, filters timestamps of input clock signal CLKIN before using the digital timestamps for frequency offset error detection or phase error detection. Filter 602 provides the first difference of timestamps, which is a period representation of input clock signal CLKIN. The output of filter 602 is a digital period representation in timestamp units and all subsequent calculations of monitor 600 are in timestamp units. Higher order filter 604 (e.g., a fourth-order low-pass filter) reduces or eliminates noise (e.g., jitter/or wander) accompanying input clock signal CLKIN to provide accurate error detection as described further below. Since typical clock standards tolerate predetermined amounts of noise, only phase errors or frequency errors greater than corresponding threshold values trigger an alarm.

A moving average filter provides real time or continuous monitoring of the input data that tracks transients. The moving average filter difference equation and frequency response are:

$$y[n] = \frac{1}{R}\sum_{k=0}^{R-1} x[n-k],$$

which represent the first R terms of a geometric series, and $$H_{lp} = \frac{1}{R}\left[\frac{1-Z^{-R}}{1-Z^{-1}}\right].$$

Since the frequency response of a moving average filter is similar to the frequency response of a cascaded integrator-comb filter, i.e., $$H_{cic} = \left[\frac{1-Z^{-R}}{1-Z^{-1}}\right],$$

in at least one embodiment, higher order filter 604 includes a cascaded integrator-comb filter stage that implements the moving average filter function. The cascaded integrator-comb filter stage decimates (i.e., filters and down-samples) the clock period information received from filter 602, and like a moving average filter, eliminates dead time issues of filters used in conventional monitor circuits that analyze a single window with discontinuities in measurement.

Conventional monitor circuits use only one filter stage that fixes the time resolution and frequency resolution to a single combination that trades off speed of error detection with accuracy of error detection and limits use of the monitor circuit to specific applications. In at least one embodiment of higher-order filter 604, to detect localized temporal changes (i.e., relatively high temporal resolution) with relatively high frequency resolution (e.g., errors in ppm), an error monitoring technique reduces or minimizes the time-bandwidth product (i.e., $\Delta t \times \Delta f$) by implementing higher order filter 604 using a plurality of filter stages with varying time resolution and frequency resolution.

In at least one embodiment, higher order filter 604 uses a plurality of moving average filters that approximate a Gaussian window filter, which provides a low time-bandwidth product. Higher order filter 604 analyzes signals that include slowly varying components and rapidly changing transient events. Higher order filter 604 partitions the input data stream into smaller sections (i.e., smaller frames) and higher order filter 604 is partitioned into smaller filter sections. Thus, higher order filter 604, which includes a plurality of cascaded integrator-comb filter stages coupled in series to provide a suitable time resolution for relatively fast detection and relatively high frequency resolution for relatively accurate implementation, to achieve a target time-frequency resolution.

Figure 7:
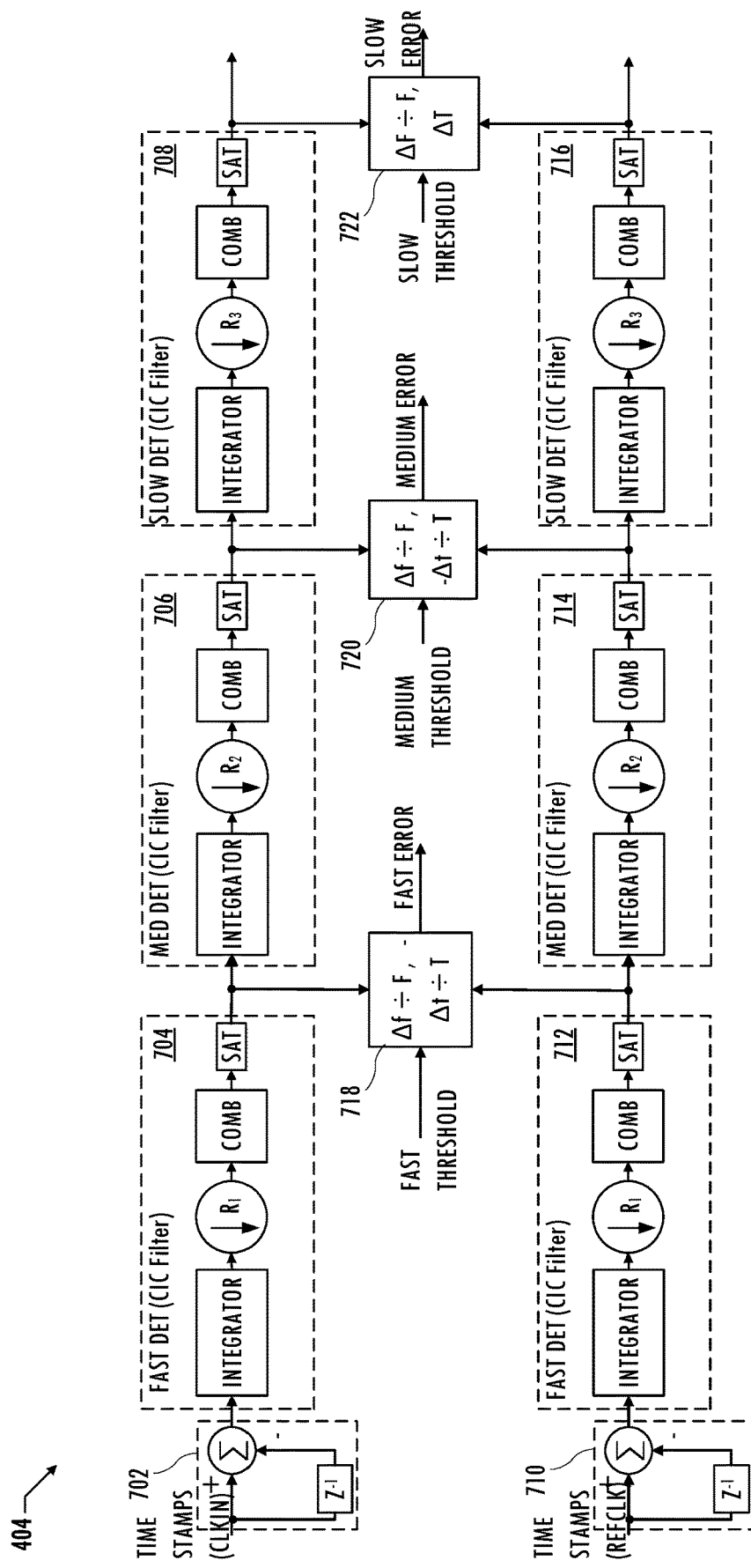
FIG. 7 illustrates a functional block diagram of frequency monitor circuitry using a plurality of cascaded integrator-comb filter stages coupled in series consistent with at least one embodiment of the invention.

FIG. 7 illustrates an exemplary frequency monitor circuit topology that approximates a Gaussian filter using three cascaded integrator-comb filter stages coupled in series. The cascaded integrator-comb filter stages are easily implemented in integrated circuit design at relatively low cost since the integrator-comb filter stages do not use multiplication operations and use only addition and subtraction operations. The first stages (e.g., stage 704 and stage 706 of the reference clock signal path and stage 712 and stage 714 of the input clock signal path) of each filter path provide relatively high time localization and relatively fast frequency offset error detection. The last stages of each filter path (e.g., stage 706 and stage 708 of the reference clock signal path and stage 714 and stage 716 of input clock signal path) provide relatively high frequency resolution. The outputs of the filter stages in each filter path are provided to corresponding error detection circuits that, in combination, provide fast and accurate detection of frequency errors.

For example, the period representation of reference clock signal REFCLK and the period representation of input clock signal CLKIN (e.g., the first difference of timestamps provided by filter 702 and the first difference of timestamps provided by filter 710, respectively) are input to corresponding filter paths. Each cascaded integrator-comb stage of a corresponding filter down-samples the received signal by $R_m$. Each value of $R_m$ is an integer power of two to facilitate hardware design and analysis. Each cascaded integrator-comb filter stage may use a different value of $R_m$ (e.g., $R_1$, $R_2$, and $R_3$ where m equals 1, 2, . . . M, and M=3). In some embodiments, the values of $R_m$ are controllable to adjust the frequency monitor according to a target application. A transfer function for each of the exemplary filter paths of FIG. 7 is:

$$H_{fr} = \left[\frac{1-Z^{-R_1}}{1-Z^{-1}}\right] \times \left[\frac{1-Z^{-R_2}}{1-Z^{-1}}\right]^2 \times \left[\frac{1-Z^{-R_3}}{1-Z^{-1}}\right],$$

where $N_1=1$ for stage 704 and stage 712, $N_2=2$ for stage 706 and stage 714, and $N_3=1$ for stage 708 and stage 716, where $N_m$ is the number of integrator and comb stages per filter stage m.

Figure 8:
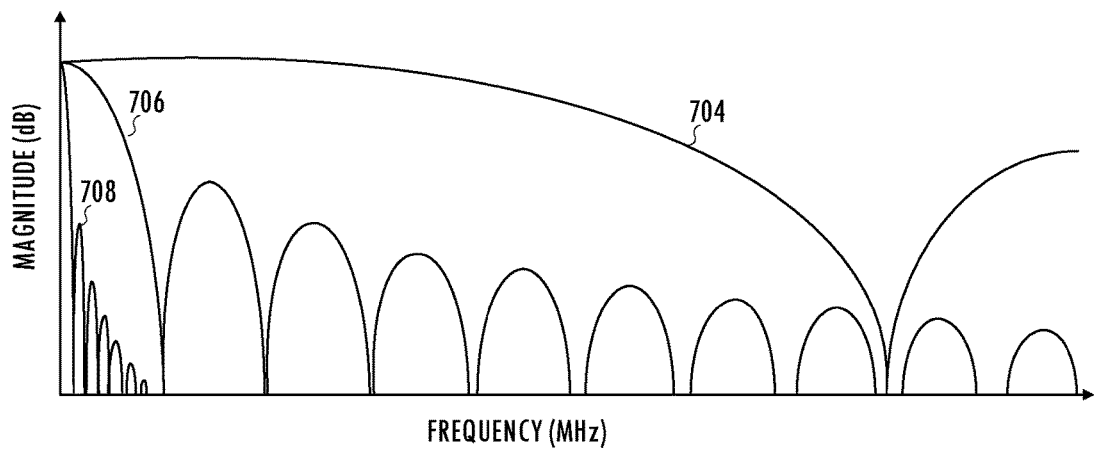
FIG. 8 illustrates exemplary magnitude responses for the plurality of stages of the frequency monitor circuitry or phase monitor circuitry consistent with at least one embodiment of the invention.

In at least one embodiment of frequency monitor 404, filter stage 704 and filter stage 712 are first-order cascaded integrator-comb filter stages that implement a down-sampling plus a difference function on corresponding timestamps using the integrator function of an analog-to-digital converter that provides the timestamps. Filter stage 706 and filter stage 714 are second-order cascaded integrator-comb filter stages that provide increased attenuation to quantization noise from the analog-to-digital conversion of the time stamps and any jitter/wander of the clock signals. Filter stage 708 and filter stage 716 are first-order cascaded integrator-comb filter stages that provide additional filtering of jitter and wander noise for improved accuracy and frequency resolution. FIG. 8 illustrates a frequency response of the exemplary frequency monitor 404 of FIG. 7. The exemplary structure provides an overall fourth-order filtering of noise.

The relatively fast stages (i.e., filter stage 704 and filter stage 712) and the middle stages (i.e., filter stage 706 and filter stage 714) address fine temporal changes for error detection, while the relatively slow stages (filter stage 708 and filter stage 716) address the frequency resolution of the error detection. If time resolution is $T_r$, then two impulses separated by at least $T_r$ will provide two distinct peaks at the output of the filter. The time stamp resolution is a worst-case resolution of time-to-digital converter 505 or time-to-digital converter 503, if the input signal is an ideal clock signal. However, in practice, time stamp information includes random and deterministic noise. An exemplary time-to-digital converter 505 or time-to-digital converter 503 has a time stamp resolution of 16 ps. Table 1 illustrates circuit measurement resolution that is obtained by an exemplary frequency monitor circuit having $T_r$=16 ps.

TABLE 1

Circuit Measurement Resolution

| | $R_m$ | Frequency | Detection Time (ns) | Resolution (ppm) |
|---|---|---|---|---|
| Input Clock | | 16384000 | | |
| Fast Div Ratio | 5 | 512000 | 1953.13 | 1.4482 |
| Medium Div Ratio | 4 | 16000 | 62500 | 0.004 |
| Slow Div Ratio | 2 | 2000 | 500000 | 0.0002 |

Frequency monitor 404 uses shorter windows (e.g., low cumulative value of $R_1$, $R_2$, and $R_3$ from the output of filter 702 to the input to detection circuit 718) to detect high frequency transients and longer windows (e.g., high cumulative value of $R_1$, $R_2$, and $R_3$ from the output of filter 702 to the input to detection circuit 722) for lower frequencies. If the noise is random, the circuit reduces the noise by a factor of $\sqrt{N}$ where N is the number of samples used by filter 702. For other types of noise (e.g., shaped noise or sinusoidal noise), the amount of noise reduction varies although increasing the number of samples used in the averaging filter improves resolution.

Figure 9:
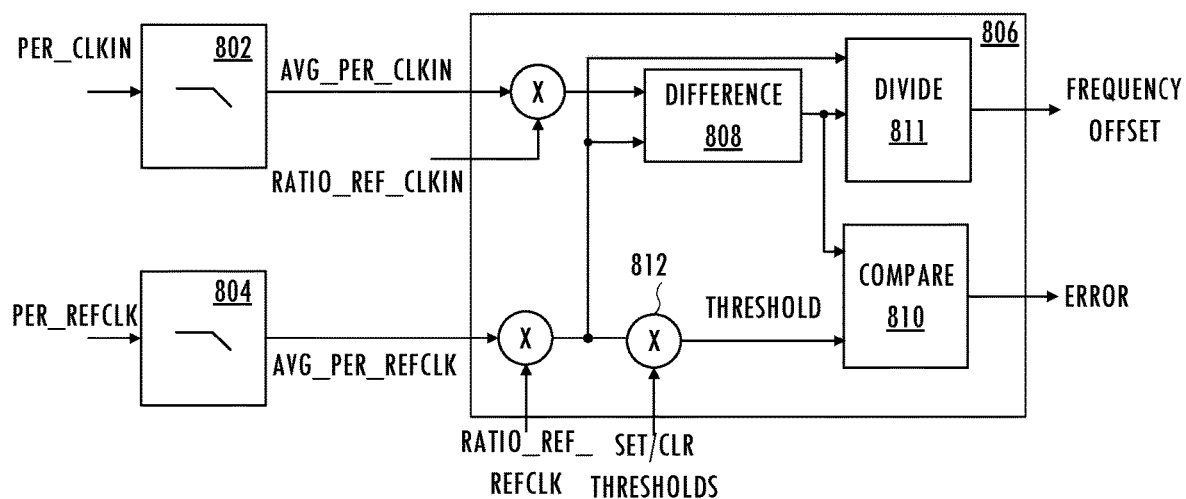
FIG. 9 illustrates a functional block diagram of an exemplary error detection circuit for use in frequency monitor circuitry or phase monitor circuitry consistent with at least one embodiment of the invention.
Figure 10:
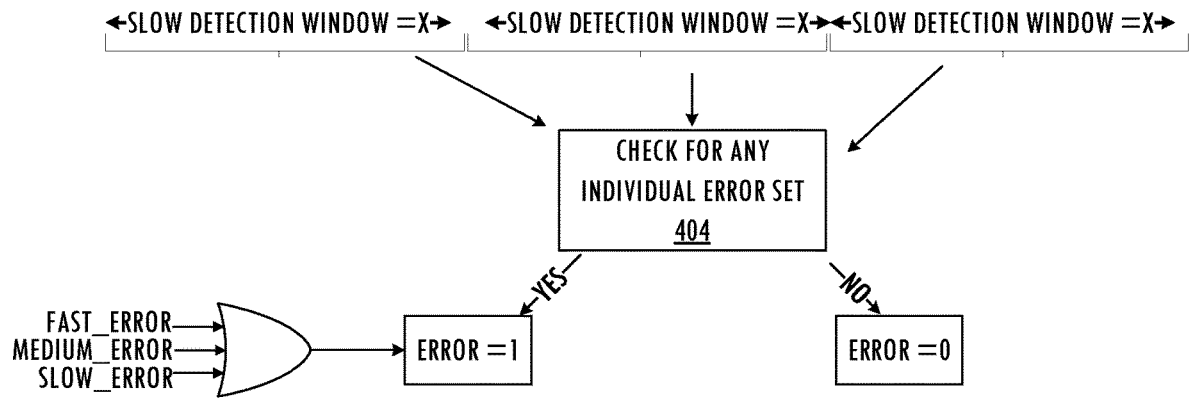
FIG. 10 illustrates an exemplary error detection decision for use in frequency monitor circuitry or phase monitor circuitry consistent with at least one embodiment of the invention.
Figure 11:
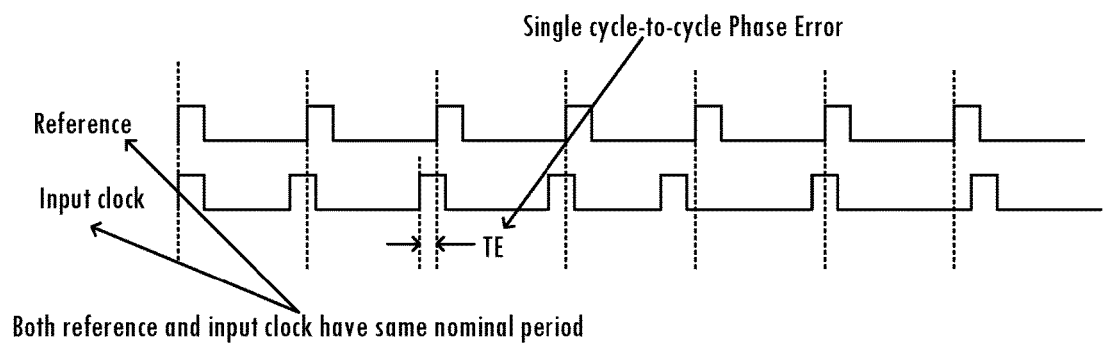
FIG. 11 illustrates exemplary timing waveforms showing a phase error between an input clock signal and a reference clock signal.
Figure 12:
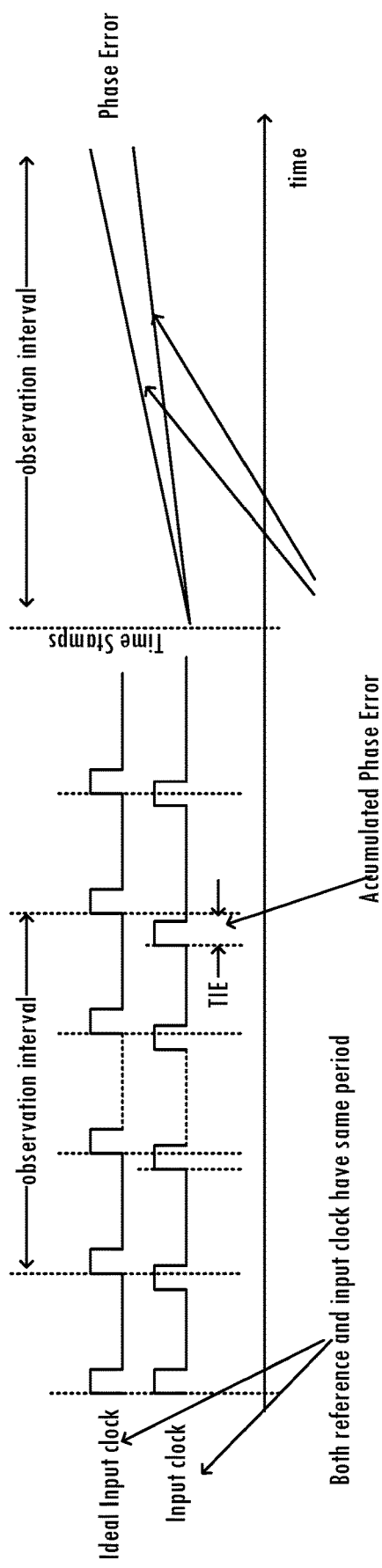
FIG. 12 illustrates exemplary waveforms showing an accumulated phase error between an input clock signal and an ideal input clock signal.
Figure 13:
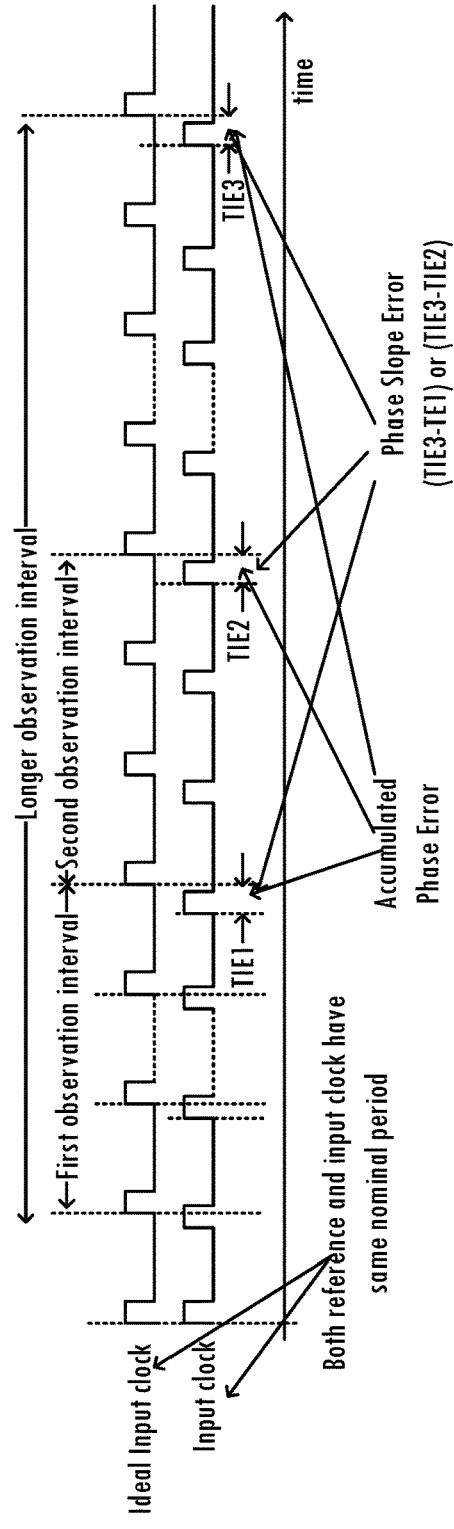
FIG. 13 illustrates exemplary waveforms showing an accumulated phase error between an input clock signal and an ideal input clock signal and phase slope error.

Frequency monitor 404 includes detection circuit 718, detection circuit 720, and detection circuit 722, which generate a fast error indicator, a medium error indicator, and a slow error indicator, respectively. Each of those error detection circuits generates an output error signal based on a comparison of the filter stage output for the reference clock signal to the filter stage output for the input clock signal and a threshold difference value. An exemplary generic error detection circuit that may be configured for detection circuit 718, detection circuit 720, or detection circuit 722, is illustrated in FIG. 9. Monitor circuit 806 provides period information PER_REFCLK and PER_CLKIN to filter 802 and filter 804, respectively, which generate average values AVG_PER_REFCLK and AVG_PER_CLKIN, respectively. In at least one embodiment of monitor circuit 806 normalizes the average period information to a common nominal period for comparison (e.g., using corresponding fractional numbers RATIO_REF_CLKIN and RATIO_REF_REFCLK). Difference circuit 808 compares the average period of the reference clock to the average period of the input clock signal and provides that difference to comparison circuit 810. Divide circuit 811 outputs a frequency offset measurement (e.g., in ppm) indicating a real-time frequency offset between input clock signal CLKIN and reference clock signal REFCLK. Multiplier 812 sets or clears a threshold value based on the average period of the reference clock signal. Comparison circuit 810 compares the difference to a threshold value and generates an error signal accordingly. The threshold values used for each stage are determined based on specifications for measurement accuracy and threshold and detection times. Error indicator ERROR is a composite frequency error determined based on the combination of all error signals generated by the individual stages of frequency monitor 404, as illustrated in FIG. 10. Frequency monitor 404 asserts the composite error signal as soon as the detection circuits assert FAST ERROR, MEDIUM ERROR, or SLOW ERROR. In at least one embodiment, frequency monitor 404 clears the composite error signal only after clearing all of the individual alarms for a slow detection window cycle. As a result, frequency monitor 404 has sufficient frequency resolution at relatively low frequencies and sufficient time resolution at relatively high frequencies. The loss in time resolution at relatively low frequencies is inconsequential since the frequency components are relatively constant. The loss in frequency resolution at relatively high frequency has a negligible effect since relatively high frequency components are primarily transient events that require sufficient time resolution for separation and identification.

FIGS. 11-14, illustrate various types of phase error (i.e., time error). Single cycle-to-cycle phase error is the difference between time reported by a clock edge compared to time reported by a reference clock edge when those clocks signals have the same nominal period. Accumulated phase error (i.e., time interval error) is the variation in time delay of a signal relative to an ideal timing signal over an observation interval. In terms of single cycle-to-cycle phase error, accumulated phase error is the single cycle-to-cycle phase error integrated over the observation interval. Time interval error may also be defined as the difference between an observed clock edge and the expected clock edge over an observation interval. Phase slope error is defined as the phase error movement or change form a first observation interval to a second observation interval.

Figure 14:
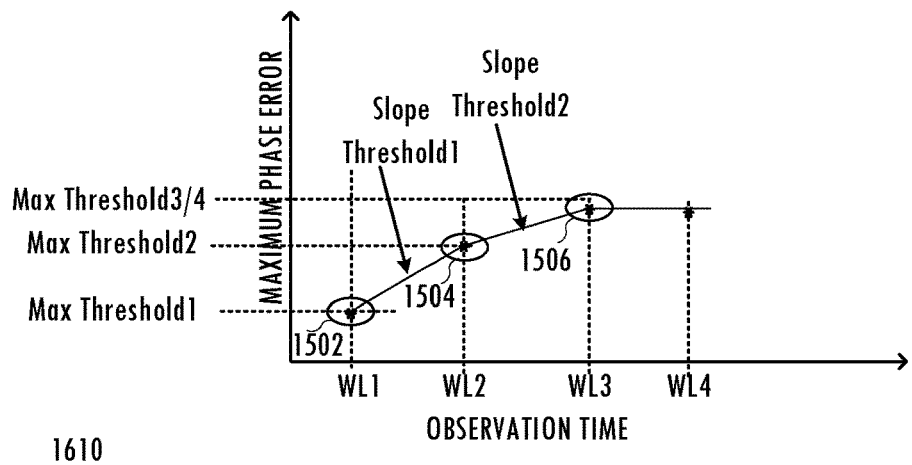
FIG. 14 illustrates exemplary phase error, slope and transient detection information consistent with at least one embodiment of the invention.

FIG. 14 illustrates exemplary specifications for short term phase transient response in a network synchronization application. In general, clock signals in a network synchronization system can experience relatively short interruptions, e.g., loss of clock signal, clock signal in holdover, which causes the clock signal to accumulate phase error as compared to an ideal clock signal. Different phase error thresholds can be used for different observation intervals during which timestamp information is windowed and averaged. For example, if single cycle-to-cycle phase error 1502 measured using window length 1 is below max threshold 1, then the single cycle-to-cycle phase error satisfies the exemplary specification. Similarly, if accumulated phase error 1504 measured using window length 2 or accumulated phase error 1506 measured using window length 3 are below max threshold 2 or max threshold 3, respectively, then the accumulated phase error satisfies the exemplary specification. In addition, the slope measurement based on phase error measurements of window length 1 and window length 2 must be below slope threshold 1 for phase slope error to satisfy the exemplary specification. Similarly, a slope measurement based on phase error measurements of window length 2 and window length 3 must be below slope threshold 2 for phase slope error to satisfy the exemplary specification.

Figure 15:
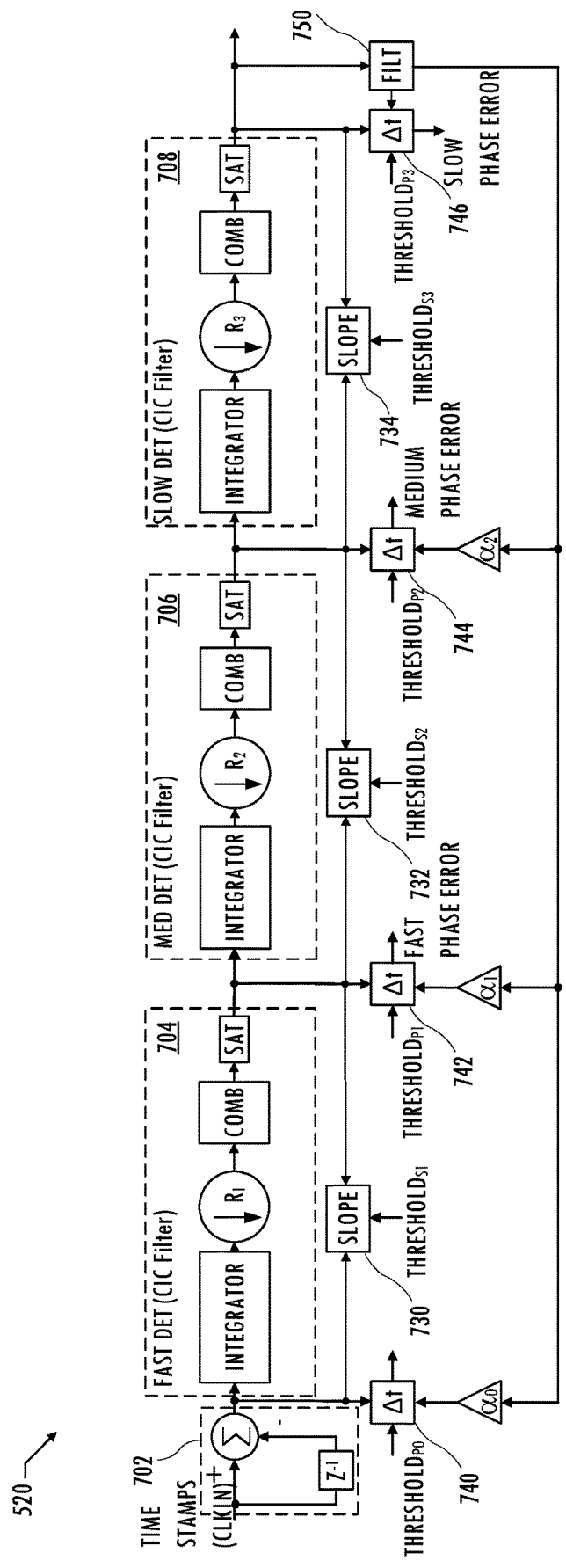
FIG. 15 illustrates a functional block diagram of exemplary phase error monitor circuitry consistent with at least one embodiment of the invention.
Figure 16:
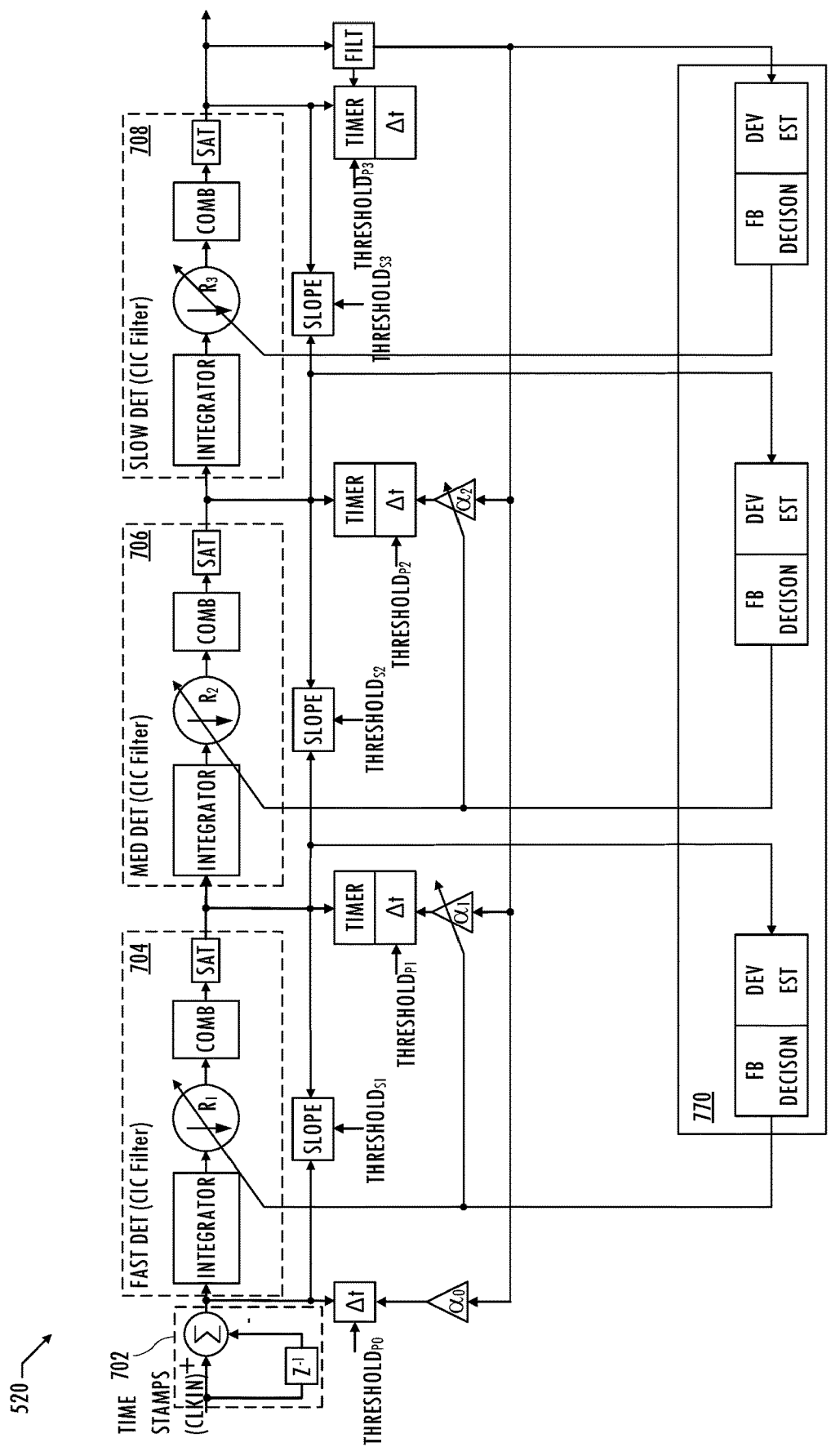
FIG. 16 illustrates a functional block diagram of an exemplary phase error monitor circuitry with adaptive control consistent with at least one embodiment of the invention.

FIG. 15 illustrates the architecture of an exemplary phase monitor that can be used to detect phase error, accumulated phase error and phase slope or phase movement error for a programmable observation interval. In at least one embodiment, phase monitor 520 reuses some filtering stages (e.g., stage 704, stage 706, and stage 708) used by frequency monitor 404, to save a substantial amount of integrated circuit area and reduce power consumption. However, other embodiments of phase monitor 520 include dedicated filter stages. Phase monitor 520 detects phase movement of input clock signal CLKIN and determines whether those phase movements are within allowable phase movements defined by an associated specification.

Referring to FIG. 14, the highly filtered clock period representation at the output of filter stage 708 provides the mean or expected clock period to which the incoming clock period is compared at the outputs of various filtering stages to detect phase errors. Phase monitor 520 does not use a reference clock signal for phase error detection. Instead, phase monitor 520 uses the already measured mean period information to detect phase errors. Accordingly, phase transients that occur in input clock signal CLKIN, e.g., short phase transients, medium phase transients, and long phase transients, are captured and analyzed to determine whether input clock signal CLKIN has departed from target specifications. In at least one embodiment, phase monitor 520 applies scaling factors $\alpha_0$, $\alpha_1$, $\alpha_2$, or $\alpha_3$ to normalize the average period (e.g., in timestamp units) and provide normalized versions of the average period to phase error detection circuits 740, 742, 744, and 746. Phase error detection circuit 740 determines whether a difference between a normalized average period to the period of the input clock signal CLKIN exceeds predetermined threshold period THRESHOLD$_{P0}$ to generate a phase error signal. Phase error detection circuits 742, 744, and 746 determine whether a difference between the normalized average period and the mean period information corresponding to each filter stage exceeds predetermined threshold period, THRESHOLD$_{P1}$, THRESHOLD$_{P2}$, and THRESHOLD$_{P3}$, respectively, to generate error signals FAST PHASE ERROR, MEDIUM PHASE ERROR, and SLOW PHASE ERROR, respectively.

In at least one embodiment, phase monitor 520 includes filter 750 that outputs a mean period or median period based on average period samples that are available before being used for phase error detection. A median filter is a sliding window of data sample values that outputs a median value of the window of data samples. Unlike a moving-average filter that computes a mean of the window values that can be affected by large-amplitude outliers, a median filter selects the median value as its output. That is, the median filter sorts samples after each new sample is introduced into the data window. The median value selected as the output mean period is midway between all the mean period values in the window. Using the median filter output for phase error detection rather than raw mean values reduces or eliminates outliers and bias introduced by the moving average filter due to non-stationary noise. However, filter 750 introduces additional hardware, which increases circuit cost. An exemplary filter 750 has a sample length of 5 to 10 samples.

In at least one embodiment, phase monitor 520 includes slope monitor 730, slope monitor 732, and slope monitor 734, that track the difference in phase error between outputs of adjacent stages and trigger corresponding error signals if the phase error change (i.e., slope) exceeds a corresponding programmable threshold. For example:

$$\text{slope} = \frac{ph(\text{fast}) - ph(\text{medium})}{\text{\# data points}}.$$

The values of THRESHOLD$_{S1}$, THRESHOLD$_{S2}$, and THRESHOLD$_{S3}$ are programmable to meet different system specifications for tolerance of some transient behavior. Phase monitor 520 continuously calculates the mean period, thus no dead time is present in the measurement.

Referring to FIGS. 7 and 15, in at least one embodiment, hardware filters of frequency monitor 404 and phase monitor 520 are configured with settings for worst-case scenarios, which causes those monitors to operate in suboptimal ranges in some situations. However, the clock quality and clock transient behavior and associated specifications vary with target application. Accordingly, in at least one embodiment, frequency monitor 404 and phase monitor 520 are included in a system that modifies the associated filter settings according to the target application. For example, $R_m$ of each of cascaded integrator-comb filter stage is controllable either by an external control technique or by an internal adaptive algorithm. In at least one embodiment, the internal adaptive algorithm is implemented by adaptive control logic 770, which includes a processor executing software (e.g., including firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

Adaptive control logic 770 adjusts phase monitor 520 in response to variations in statistical properties of an input clock signal (e.g., timestamps of input clock signal CLKIN). Adaptive control logic 770 initializes phase monitor 530 with default filter parameters. Adaptive control logic 770 adjusts filter stage coefficients, e.g., the filter window length, $R_m$, during operation of the phase monitor 520 in the target application. Adaptive control logic 770 updates the window lengths after the system enters an adaptive mode. Adaptive control logic 770 identifies whether other settings provide faster error detection without causing false alarms, while maintaining accuracy of detection.

In at least one embodiment, adaptive control logic 770 uses the Allan variance, which is a technique for representing root mean square (RMS) random drift error as a function of averaging time. The Allan variance can be used to determine characteristics of the underlying random processes that cause noise. The adaptive algorithm determines time variance TVAR (i.e., two-sample variance) of a clock signal. The square root of TVAR is referred to as TDEV (i.e., time deviation), which is a measure of time-stability based on modified Allan variance to characterize the frequency stability of a clock signal:

$$TDEV(\tau) = \sigma(\tau) = \sqrt{\frac{1}{6n^2(N-3n+1)} \sum_{j=0}^{N-3n} \left[ \sum_{i=j}^{n+j-1} x_{i+2n} - 2x_{i+n} + x_i \right]^2},$$

for $$n = 1, 2, \ldots \left[\frac{N}{3}\right],$$

where x are the integrated phase samples output from each intermediate filter stage. The technique includes estimating the variance or deviation of the time period of input clock signal CLKIN and comparing it to a corresponding threshold to determine whether a filter window length adjustment will improve error detection performance. In at least one embodiment of adaptive control logic 1700, the Allan variance is defined as function of cluster length and is different for each filter stage of the circuit.

Figure 18:
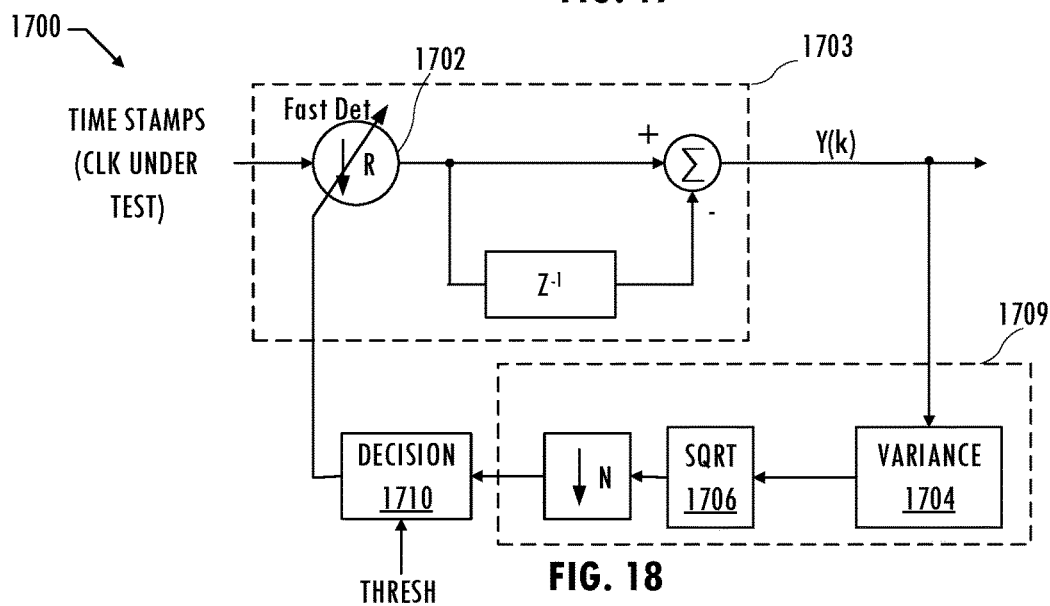
FIG. 18 illustrates a functional block diagram of an adaptive control technique consistent with at least one embodiment of the invention.

Referring to FIG. 18, adaptive control logic 1700 adjusts a window length R of filter stage 1703 over exemplary ranges of time deviation by adjusting decimator 1702. In at least one embodiment of adaptive control logic 1700, time deviation logic 1709 includes variance logic 1704 that computes the two sample variance, which is defined as:

$$\sigma^2(\tau) = \frac{1}{2} \langle (y(k) - y(k-1))^2 \rangle = \frac{1}{2\tau^2} \langle (x_{k+2} - 2x_{k+1} + x_k)^2 \rangle,$$

where y(k) provided by filter 1703 is the kth fractional frequency average over the observational interval i and square root operator 1706 provides the time deviation. The <-> denotes the ensemble average, which is a statistical representation that uses an average of N time averages of time stamps to account for the signal input $x^i(t)$ including randomly varying noise, where the time average is $$\overline{\text{mean} x^i(t)} = \lim_{T \to \infty} \frac{1}{T} \int_0^T x^i(t) dt,$$

and the ensemble average is $$\langle x(t_1) \rangle = \lim_{N \to \infty} \frac{1}{N} \sum_{i=1}^{N} x^i(t_1).$$

Adaptive control logic 1700 synchronously adjusts the filter window lengths of phase monitor 520 or frequency monitor 404 to reduce or eliminate errors in detection due to the adaptive control logic (e.g., adjusts the filter window lengths only at the transition of window edges). In the three-stage filter topology described above, the fast detection window and medium detection window are adjusted to trigger faster detection and the slow detection window is used to provide highest frequency resolution.

Referring to FIG. 18, in at least one embodiment, the fractional frequency average is the output of first order difference filter 1703 of width R which is the detection filter stage of the measurement circuit. For example, Allan deviation of $1.6 \times 10^{-9}$ at observation time of one second is interpreted as indicating an instability of frequency between two observations, one second apart, with a relative root mean square value of $1.6 \times 10^{-9}$, which is equivalent to 16 mHz RMS movement for a 10 MHz clock. Decision logic 1710 compares the time deviation to at least one programmable threshold. The confidence interval of the estimate varies with factors like averaging length, number of data points, desired statistical confidence, etc. Decision logic 1710 generates a control signal that adjusts the filter window R, e.g., by +1 or −1, and eventually converges at an optimal window length for the environment in which the monitor technique operates. Accordingly, adaptive control logic 1700 has a settling time requirement that allows the circuit to converge. Adaptive control logic 1700 averages the new time deviation or time variance for programmable data points. Although the adaptive control technique is described for measurement and analysis frequency and phase errors in timing signals, the techniques described herein may be adapted to data in other types of sensors.

Figure 17:
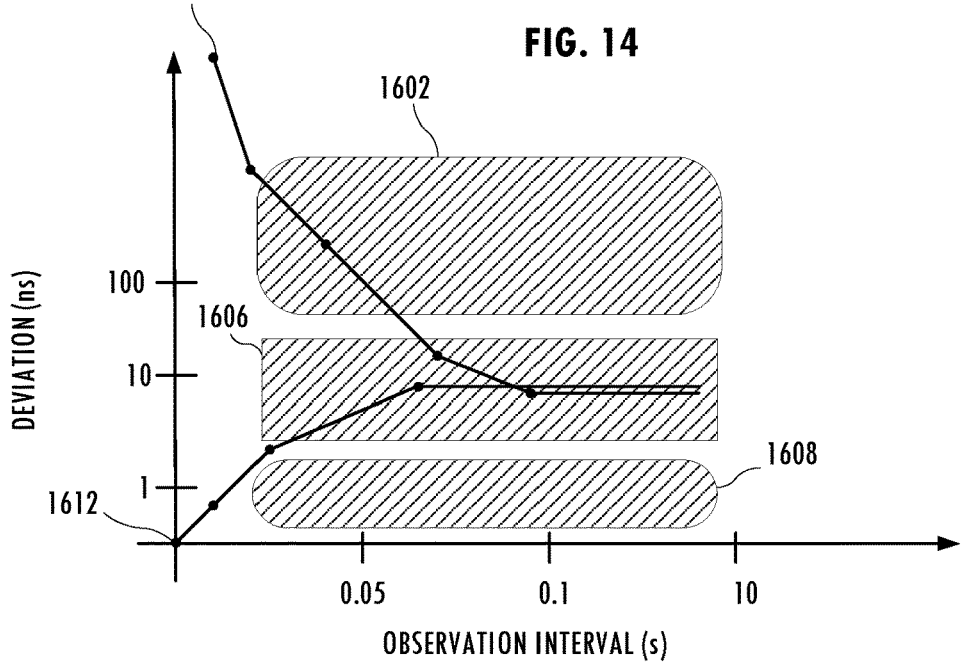
FIG. 17 illustrates exemplary deviation ranges while adaptive control is enabled.

Referring to FIGS. 17 and 18, in an exemplary embodiment, adaptive control logic 1700 is initialized with a predetermined upper limit that is an average value plus N σ, and a predetermined lower limit that is the average value minus N σ, as illustrated by region 1606. Adaptive control logic 1700 allows the decimation ratio (i.e., filter window R) to converge to an optimal setting without a priori knowledge of the target application. Adaptive control logic 1700 adjusts the filter length to a small detection time window for deviation range and observation interval 1602. Adaptive control logic 1700 increases a filter length ($R_m=R_m+1$) in response to the deviation ranges within region 1602 and decreases the filter length ($R_m=R_m-1$) in response to the deviation ranges within region 1608. In at least one embodiment, adaptive control logic 1700 converges on a filter window R having a value that minimizes a mean-squared error of the associated phase error measurement. Response of adaptive control logic 1700 for exemplary cases of a filter window R having a worst-case value 1610 and for a filter window R that has no predetermined default value 1612 both converge in region 1606.

Thus, techniques for quickly and accurately detecting phase errors without a priori knowledge of the target application have been described. The description of the invention set forth herein is illustrative and is not intended to limit the scope of the invention as set forth in the following claims. For example, while the invention has been described in an embodiment in which three filter stages are coupled in series, one of skill in the art will appreciate that the teachings herein can be utilized with other numbers of filter stages coupled in series. Variations and modifications of the embodiments disclosed herein may be made based on the description set forth herein, without departing from the scope of the invention as set forth in the following claims.

What is claimed is:

1. An apparatus for providing a clock signal based on a received clock signal, the apparatus comprising:
    a time-to-digital converter configured to generate timestamp information based on the received clock signal;

a first filter configured to generate clock period information based on the timestamp information; and
a phase monitor circuit comprising:
  a second filter configured to provide a mean period signal of the received clock signal based on the clock period information; and
  a phase error detection circuit configured to generate a phase error indicator based on a threshold difference value and a difference between the clock period information and expected clock period information, the expected clock period information being based on the mean period signal.

2. The apparatus, as recited in claim 1, wherein the phase monitor circuit further comprises a third filter configured to provide as the expected clock period information, a median value of the mean period signal over a sliding window of time or a mean value of the mean period signal over the sliding window of time.

3. The apparatus, as recited in claim 1, wherein the expected clock period information is the mean period signal.

4. The apparatus, as recited in claim 1, wherein the second filter comprises a plurality of cascaded integrator-comb filter stages coupled in series.

5. The apparatus, as recited in claim 4, wherein for each cascaded integrator-comb filter stage of the plurality of cascaded integrator-comb filter stages, the phase monitor circuit further comprises:
  a slope detection circuit configured to generate a transient error signal based on an input period to the cascaded integrator-comb filter stage, a mean output period of the cascaded integrator-comb filter stage, and a slope threshold value corresponding to the cascaded integrator-comb filter stage.

6. The apparatus, as recited in claim 4, wherein the phase error detection circuit further comprises a detection circuit configured to generate transient information for a cascaded integrator-comb filter stage of the plurality of cascaded integrator-comb filter stages responsive to an input to the cascaded integrator-comb filter stage, a threshold value for the cascaded integrator-comb filter stage, and the expected clock period information.

7. The apparatus, as recited in claim 1, further comprising a frequency monitor circuit comprising:
  a second time-to-digital converter configured to generate second timestamp information based on a reference clock signal;
  a third filter configured to generate reference clock period information based on the second timestamp information;
  a fourth filter configured to provide a mean reference period signal of the reference clock signal; and
  a frequency error detection circuit configured to generate a frequency error indicator based on a threshold frequency difference value and a second difference between the mean period signal and the mean reference period signal.

8. The apparatus, as recited in claim 1, further comprising:
  a control circuit configured to enable a clock holdover mode or a hitless switching mode based on the phase error indicator.

9. The apparatus, as recited in claim 8, wherein the phase error indicator is further based on an additional threshold difference value and an additional difference between additional clock period information provided by intermediate filter stages of the second filter and the expected clock period information.

10. The apparatus, as recited in claim 1, further comprising:
  an adaptive control circuit configured to update a parameter of the second filter based on a time variance estimate for the received clock signal.

11. The apparatus, as recited in claim 10, wherein the second filter comprises a plurality of cascaded integrator-comb filter stages coupled in series and the parameter is a decimation ratio of a cascaded integrator-comb filter stage of the plurality of cascaded integrator-comb filter stages and the time variance estimate is based on an output of the cascaded integrator-comb filter stage.

12. A method for providing a clock signal based on a received clock signal, the method comprising:
  generating timestamp information, by a time-to-digital converter, based on the received clock signal;
  generating clock period information, by a first filter, based on the timestamp information; and
  providing a mean period signal of the received clock signal, by a second filter in a phase monitor circuit, based on the clock period information; and
  generating a phase error indicator, by a phase error detection circuit in the phase monitor circuit, based on a threshold difference value and a difference between the clock period information and expected clock period information, the expected clock period information being based on the mean period signal.

13. The method, as recited in claim 12, wherein generating the phase error indicator comprises providing as the expected clock period information, a median value of the mean period signal over a sliding window of time or a mean value of the mean period signal over the sliding window of time.

14. The method, as recited in claim 12, wherein generating the phase error indicator comprises moving average filtering the clock period information over a plurality of time ranges to generate a corresponding mean period signal for each time range of the plurality of time ranges.

15. The method, as recited in claim 14, wherein the plurality of time ranges include a first interval providing a first detection time and a first measurement resolution and a second interval having a second detection time and a second measurement resolution, the first interval being substantially shorter than the second interval, the first detection time being substantially faster than the second detection time, and the first measurement resolution being substantially lower than the second measurement resolution.

16. The method, as recited in claim 14, further comprising:
  detecting a rate of change of the mean period signal for each time range; and
  generating a transient error signal based on the rate of change and a threshold rate of change for each time range of the plurality of time ranges.

17. The method, as recited in claim 14, further comprising:
  updating each time range of the plurality of time ranges in response to an output of a moving average filter over a corresponding time range of the plurality of time ranges.

18. The method, as recited in claim 12, further comprising:
  entering a holdover mode or a hitless switching mode in response to the phase error indicator.

* * * * *